United States Patent
Feng et al.

(10) Patent No.: US 11,167,991 B2
(45) Date of Patent: Nov. 9, 2021

(54) METHOD FOR PREPARING CARBON NANOTUBE/POLYMER COMPOSITE

(71) Applicant: TIANJIN UNIVERSITY, Tianjin (CN)

(72) Inventors: Wei Feng, Tianjin (CN); Fei Zhang, Tianjin (CN); Yiyu Feng, Tianjin (CN); Mengmeng Qin, Tianjin (CN)

(73) Assignee: Tianjin University, Tianjin (CN)

( * ) Notice: Subject to any disclaimer, the term of this patent is extended or adjusted under 35 U.S.C. 154(b) by 94 days.

(21) Appl. No.: 16/123,279

(22) Filed: Sep. 6, 2018

(65) Prior Publication Data
US 2019/0322826 A1 Oct. 24, 2019

(30) Foreign Application Priority Data
Apr. 19, 2018 (CN) .......................... 201810355067.5

(51) Int. Cl.
*C23C 10/02* (2006.01)
*C23C 10/28* (2006.01)
(Continued)

(52) U.S. Cl.
CPC ............ *C01B 32/162* (2017.08); *B29C 70/68* (2013.01); *B29C 70/682* (2013.01);
(Continued)

(58) Field of Classification Search
CPC ............ C23C 14/0026; C23C 14/0047; C23C 14/0605; C23C 14/08; C23C 14/10;
(Continued)

(56) References Cited

U.S. PATENT DOCUMENTS

| 7,288,490 B1 * | 10/2007 | Delzeit | ................ | B82Y 30/00 |
| | | | | 257/E21.128 |
| 8,809,212 B1 * | 8/2014 | Dirk | ...................... | D01D 5/003 |
| | | | | 442/327 |

(Continued)

FOREIGN PATENT DOCUMENTS

| CN | 102140762 B | * | 6/2012 |
| CN | 102709399 A | | 10/2012 |

(Continued)

OTHER PUBLICATIONS

Derwent abstract 2017-50705W of CN 106955678 A, "Preparing porous nano-composite fiber membrane useful for removing heavy metal and ions, . . . "; published Jul. 18, 2017, by H. Chou et al.*

(Continued)

*Primary Examiner* — Dah-Wei D. Yuan
*Assistant Examiner* — Kristen A Dagenais-Englehart
(74) *Attorney, Agent, or Firm* — RatnerPrestia

(57) ABSTRACT

Provided is a method for preparing a carbon nanotube/polymer composite material, including: coating a nano-silicon oxide film on the surface of a porous polymer by vacuum coating; depositing a metal catalyst nano-film on the nano-silicon oxide film by vacuum sputtering; growing a carbon nanotube array in situ on the surface of the porous polymer by plasma enhanced chemical vapor deposition to obtain a carbon nanotube/polymer porous material; and impregnating the carbon nanotube/polymer porous material with a polymer and curing to obtain the carbon nanotube/polymer composite material. By using a heat-resistant polymer having a high heat-resistant temperature and a PECVD technique, a carbon nanotube array directly grows in situ on the surface of a polymer at a low temperature, which thereby overcomes the defects of the composites previously prepared, in which carbon nanotubes are difficult to be homo- (Continued)

geneously dispersed and the interfacial bonding force in the composites is weak.

4 Claims, 3 Drawing Sheets

(51) Int. Cl.
| | |
|---|---|
| C23C 10/48 | (2006.01) |
| C23C 10/60 | (2006.01) |
| C23C 28/02 | (2006.01) |
| C23C 28/00 | (2006.01) |
| C23C 14/16 | (2006.01) |
| C23C 14/32 | (2006.01) |
| C01B 32/162 | (2017.01) |
| B29C 70/68 | (2006.01) |
| C23C 14/08 | (2006.01) |
| C23C 14/18 | (2006.01) |
| C23C 14/24 | (2006.01) |
| C23C 14/34 | (2006.01) |
| C23C 16/26 | (2006.01) |
| C23C 16/50 | (2006.01) |
| C23C 16/56 | (2006.01) |
| C08J 7/04 | (2020.01) |
| C23C 14/20 | (2006.01) |
| B29K 79/00 | (2006.01) |
| B82Y 30/00 | (2011.01) |
| B82Y 40/00 | (2011.01) |

(52) U.S. Cl.
CPC ........... *B29C 70/683* (2013.01); *C08J 7/0423* (2020.01); *C23C 14/08* (2013.01); *C23C 14/185* (2013.01); *C23C 14/205* (2013.01); *C23C 14/24* (2013.01); *C23C 14/34* (2013.01); *C23C 16/26* (2013.01); *C23C 16/50* (2013.01); *C23C 16/56* (2013.01); *C23C 28/345* (2013.01); *B29K 2079/08* (2013.01); *B29K 2995/0013* (2013.01); *B82Y 30/00* (2013.01); *B82Y 40/00* (2013.01); *C08J 2363/00* (2013.01); *C08J 2371/12* (2013.01); *C08J 2379/08* (2013.01); *C08J 2463/00* (2013.01); *C08J 2471/12* (2013.01); *C08J 2479/08* (2013.01); *Y10S 977/844* (2013.01)

(58) Field of Classification Search
CPC ....... C23C 14/20; C23C 14/205; C23C 16/26; C23C 16/401; C23C 16/402; C23C 16/50–517; C23C 16/56; C23C 28/345; C08J 7/0423; C08J 2363/00–10; C08J 2371/12; C08J 2379/08; C08J 2463/00–10; C08J 2471/12; C08J 2479/08; B29C 70/68; B29C 70/682; B29C 70/683; C01B 32/162; C01B 2079/08; B29K 2995/0013; B82Y 30/00; B82Y 40/00; Y10S 997/844
USPC ....... 427/489, 525–527, 531, 562, 563, 574, 427/577, 579, 583, 588, 249.3, 249.4, 427/250, 385.5–387, 393.5, 394; 204/192.14, 192.15, 192.17, 192.23, 204/192.38
See application file for complete search history.

(56) References Cited

U.S. PATENT DOCUMENTS

| | | | |
|---|---|---|---|
| 2002/0114949 A1* | 8/2002 | Bower | C23C 16/26 428/401 |
| 2006/0003212 A1 | 1/2006 | Kim et al. | |
| 2006/0008594 A1* | 1/2006 | Kang | B82Y 30/00 427/569 |
| 2008/0170982 A1* | 7/2008 | Zhang | C01B 32/168 423/447.3 |
| 2008/0182027 A1* | 7/2008 | Vasenkov | C23C 16/503 427/450 |
| 2009/0061208 A1* | 3/2009 | Guo | B82B 3/00 428/323 |
| 2009/0143227 A1* | 6/2009 | Dubrow | D06M 11/44 502/406 |
| 2010/0273051 A1* | 10/2010 | Choi | C25D 9/04 429/213 |
| 2010/0323207 A1* | 12/2010 | Pinault | B82Y 40/00 428/446 |
| 2011/0051322 A1* | 3/2011 | Pushparaj | C23C 16/54 361/525 |
| 2011/0315951 A1* | 12/2011 | Sriraman | B01J 23/755 257/9 |
| 2012/0060826 A1* | 3/2012 | Weisenberger | B82Y 30/00 126/569 |
| 2018/0160929 A1* | 6/2018 | Ashe | A61B 5/0478 |
| 2019/0002309 A1* | 1/2019 | Cwiertny | B01J 20/261 |
| 2019/0245155 A1* | 8/2019 | Heath | H01L 51/0048 |

FOREIGN PATENT DOCUMENTS

| | | | |
|---|---|---|---|
| CN | 106008972 A | | 10/2016 |
| CN | 106955678 A | * | 7/2017 |

OTHER PUBLICATIONS

English abstract of CN 102140762 B, by Wei Qu et al., "Reinforced nanofiber porous membrane and preparation method thereof"; published Jun. 27, 2012.*

English abstract of CN 103878027 B (inventor & title unavailable); published Sep. 16, 2015.*

* cited by examiner

METHOD FOR PREPARING CARBON NANOTUBE/POLYMER COMPOSITE

CROSS REFERENCE TO RELATED APPLICATIONS

This application claims the priority of Chinese Patent Application No. 201810355067.5, filed on Apr. 19, 2018, and the disclosure of which is hereby incorporated by reference.

FIELD

The present invention relates to the technical field of carbon nanotubes, and in particular to a method for preparing a carbon nanotube/polymer composite material.

BACKGROUND

Since carbon nanotubes were discovered in 1991, they have had many potential application values in the future high-tech fields such as nano-electronic devices and hydrogen storage fuel cells, etc., due to their unusual mechanical, electrical, thermal and other properties as well as their unique quasi-one-dimensional tubular molecular structures. The carbon nanotube can be regarded as being obtained by curling two-dimensional graphene to a closed state, and its desired structure is a seamless and hollow tube which is bounded by hexagonal lattices of carbon atoms and has two ends being covered by hemispherical large fullerene molecules. The tube wall of a carbon nanotube is composed of six-membered rings of carbon, wherein carbon atoms in each of the six-membered rings are mainly $SP^2$ hybridized, and each of the carbon atoms forms a carbon-carbon σ bond by overlapping its $SP^2$ hybrid orbital with the $SP^2$ hybrid orbital of a carbon atom on an adjacent six-membered ring. Due to the formation of a spatial structure, the $SP^2$ hybrid orbital is deformed, which leads to the formation of a hybrid structure between $SP^2$ and $SP^3$.

Carbon nanotubes have excellent mechanical properties, an extremely large aspect ratio, good electrical properties, and very high chemical and thermal stability, etc., and both theoretical and experimental studies have shown that the carbon nanotubes can be used to prepare a polymer-based composite with excellent properties, and can impart the composite with good strength, elasticity, fatigue resistance and isotropism, which dramatically improves the mechanical properties of the composite. Meanwhile, the carbon nanotubes have good heat transfer properties and extremely high axial thermal conductivity, and experimental results have shown that the thermal conductivity of individual SWCNTs is up to 6000 W/(wK), and thus the carbon nanotubes are widely used to prepare thermally conductive composites. A polymer has advantages of light mass, corrosion resistance and radiation resistance, etc., such that the polymer can be applied in novel spacecrafts, however, its poor mechanical and thermal conductive properties limit the application range thereof, and thus many researchers have improved the mechanical and thermal conductive properties of the polymer by adding a carbon nano-material such as graphene, carbon nanotubes. All the existing polymer-carbon nanotube composites are prepared by using carbon nanotubes as a filler and mixing with a polymer precursor to thereby prepare carbon nanotube/polymer composite materials. This method is simple, but still has some drawbacks. For example, the carbon nanotubes have poor dispersibility in the polymer and are susceptible to agglomeration; and improvement in interfacial bonding between the carbon nanotubes and the polymer is needed, etc. Meanwhile, in order to form good bonding between the polymer and the carbon nanotubes, it is usually necessary to decorate and modify the surface of the carbon nanotubes to thereby improve the processability thereof, enhance the compatibility between the carbon nanotubes and the polymer, and increase the dispersibility of the carbon nanotubes. However, such surface decoration and modification of the carbon nanotubes will increase the defects of the carbon nanotubes, resulting in a significant decrease in thermal conductive and mechanical properties, which will seriously affect the comprehensive properties of the composite. Therefore, the existing techniques cannot satisfy the preparation of a carbon nanotube-polymer composite having high quality, high dispersibility, and high interfacial bonding.

SUMMARY

In view of this, the technical problem to be solved by the present invention is to provide a preparation method of a carbon nanotube/polymer composite material with high strength and thermal conductivity.

The present invention provides a preparation method of a carbon nanotube/polymer composite material, comprising the steps of:

coating a nano-silicon oxide film on the surface of a porous polymer by vacuum coating;

depositing a metal catalyst nano-film on the nano-silicon oxide film by vacuum sputtering;

growing a carbon nanotube array in situ on the surface of the porous polymer by plasma enhanced chemical vapor deposition to obtain a carbon nanotube/polymer porous material; and impregnating the carbon nanotube/polymer porous material with a polymer and curing to obtain the carbon nanotube/polymer composite material.

Preferably, the porous polymer is prepared by:

subjecting a polymer monomer solution to electrostatic spinning or freeze-drying to obtain the porous polymer.

Preferably, the polymer is selected from the group consisting of polyimide, phenolic resin, epoxy resin, polybenzimidazole and polyamide, or a mixture thereof.

Preferably, the nano-silicon oxide film has a thickness of 5~50 nm, and the metal catalyst nano-film has a thickness of 1~10 nm.

Preferably, the metal catalyst nano-film is selected from the group consisting of nickel, iron and cobalt, or a mixture thereof.

Preferably, the growing of the carbon nanotube array in situ is carried out at a temperature of 200~450° C. and under a pressure of 5~20 Pa.

Preferably, the growing a carbon nanotube array in situ is carried out under the following conditions: $H_2$ as a carrier gas, ethyne or methane as a carbon source, a plasma power of 10~500 W, and a growing duration of 5~60 min.

Preferably, the impregnating with a polymer is carried out under vacuum.

In the present invention, a carbon nanotube/polymer composite material with high strength and high thermal conductive properties is prepared by: preparing a polymer in a form of a porous block material by electrostatic spinning and freeze-drying; depositing a substrate and a catalyst on the surface of the polymer by vacuum coating and vacuum sputtering techniques; and then, by means of a PECVD technique, growing carbon nanotubes in situ on the surface of the polymer by a plasma enhanced deposition technique under the conditions of low temperature and negative pressure; and finally subjecting to enclosing and densification. In the resulting composite, the carbon nanotubes are grown uniformly on the surface of the porous structure of the polymer, which allows the carbon nanotubes and the polymer to bond well with each other, and meanwhile, the in situ growth technique of the array of carbon nanotubes allows the carbon nanotubes to be distributed uniformly within the pores of the composite without non-uniform dispersion and agglomeration problems, resulting in that the composite has excellent mechanical and thermal conductive properties.

DETAILED DESCRIPTION OF EMBODIMENTS

Figure 1:
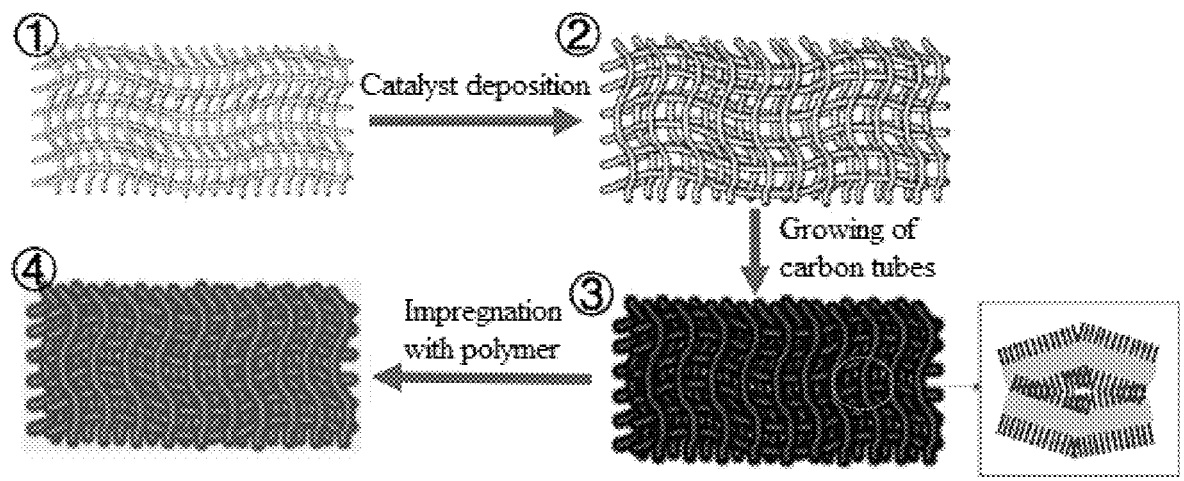
FIG. 1 is a schematic illustration of steps of a preparation method of the present invention.

The present invention provides a preparation method of a carbon nanotube/polymer composite material, comprising the steps of:

coating a nano-silicon oxide film on the surface of a porous polymer by vacuum coating;

depositing a metal catalyst nano-film on the nano-silicon oxide film by vacuum sputtering;

growing a carbon nanotube array in situ on the surface of the porous polymer by plasma enhanced chemical vapor deposition to obtain a carbon nanotube/polymer porous material; and impregnating the carbon nanotube/polymer porous material with a polymer and curing to obtain the carbon nanotube/polymer composite material.

The polymer of the polymer is selected from the group consisting of polyimide, phenolic resin, epoxy resin, polybenzimidazole and polyamide, or a mixture thereof.

The above porous polymer is preferably prepared by:

subjecting a polymer monomer solution to electrostatic spinning or freeze-drying to obtain the porous polymer.

The solvent for the polymer monomer solution can be selected according to the type of the polymer, and is preferably dimethyl acetamide (DMAC) or N-methyl pyrrolidone (NMP).

When the polymerization and curing of the polymer are difficult, a curing agent and/or an accelerator can be added into the solution of the polymer, and the type of the curing agent and accelerator can be applicable ones which are well known to those skilled in the art.

The polymer monomer solution preferably has a solid content of 10%~30%.

Then, a porous polymer fibrous mat can be prepared by an electrostatic spinning technique; or alternatively, a porous polymer material can be obtained using a freeze-drying technique in which a prepared polymer slurry is freeze-dried in liquid nitrogen, removed for the solvent therefrom and finally curing, either of which is used as a skeletal structure of the composite.

Thereafter, a layer of silicon oxide film with a nano-scaled thickness, referred to as a nano-silicon oxide film, is coated on the surface of the porous polymer by a vacuum coating technique, which serves as a substrate for growing carbon nanotubes. The silicon oxide film is supported on the surface of the polymer and the pores thereof.

The nano-silicon oxide film preferably has a thickness of 5~50 nm.

Next, a layer of metal catalyst nano-film with a nano-scaled thickness, referred to as a metal catalyst nano-film, is sputtered and deposited on the nano-silicon oxide film by vacuum sputtering, which serves as a catalyst for growing a carbon nanotube array.

The metal catalyst nano-film is preferably of one or more of metals such as nickel, iron, and cobalt.

The metal catalyst nano-film preferably has a thickness of 1~10 nm.

Subsequently, a carbon nanotube array is grown in situ on the surface of the metal catalyst nano-film by a plasma enhanced chemical vapor deposition (PECVD) process, to obtain a carbon nanotube/polymer porous composite.

Specifically, a metal catalyst-supported porous polymer is placed into a PECVD furnace, and vacuum is applied thereto to form a negative pressure within the furnace tube such that the pressure is preferably 5~20 Pa. Then, $H_2$ is introduced as a carrier gas, preferably at a flow rate of 10~100 sccm. Preferably, when the temperature is raised up to 200~450° C., a radio-frequency plasma emitter is turned on, preferably with the radio-frequency power set at 10~500 W and the radio-frequency signal frequency set at 13.56 MHz. Preferably, after treatment under the $H_2$ plasma environment for 5~30 min, ethyne or methane is introduced as a carbon source for growing carbon nanotubes, preferably at a flow rate of 10~80 sccm, during which different flow rate ratios between $H_2$ and the ethyne or methane are adjusted, with the growth time being preferably 5-60 min. After the reaction is completed, the plasma emitter is turned off, and the resultant is cooled to room temperature along with the furnace under the $H_2$ atmosphere environment.

The above temperature is lower than the maximum service temperature of the polymer, and thus the polymer does not undergo high temperature pyrolysis.

Finally, the grown carbon nanotube/polymer porous composite is impregnated with corresponding monomers for the polymer with the aid of vacuum, and then subjected to polymerization and curing processes to immobilize the carbon nanotubes and fill the pores such that the pores between the carbon nanotubes are enclosed, and by several impregnation and curing processes above, a dense carbon nanotube/polymer composite material is obtained.

Unlike the composites prepared by a blending process which is currently generally used, a microscopically ordered composite prepared by growing a carbon nanotube array in situ on the surface of a polymer in the present invention can realize directional and high-efficiency thermal conduction and mechanical enhancement, which creates a novel method for preparing an ordered carbon/polymer composite. Using a heat-resistant polymer having a high heat-resistant temperature and a PECVD technique, a carbon nanotube array can be grown at a low temperature such that the carbon nanotubes are directly grown in situ on the surface of a polymer to prepare a composite, which thereby overcomes the defects that in the composites previously prepared, carbon nanotubes are difficult to be uniformly dispersed and the interfacial bonding force in the composites is poor, creating a novel technique utilizing an ordered composite structure to improve the directional thermal conduction and strength properties of the composite.

Hereinafter, the preparation method of a carbon nanotube/polymer composite material of the present invention will be described in detail in combination with examples in order to further illustrate the present invention.

EXAMPLE 1

Figure 2:
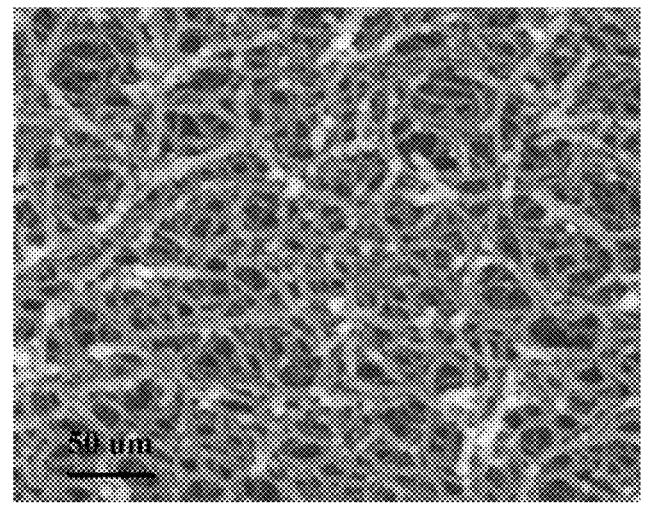
FIG. 2 is a scanning electron micrograph of a porous polyimide prepared in the present invention.

(1) 3,3,4,4-biphenyltetracarboxylic dianhydride (BPDA) and 4,4'-oxydianiline (ODA) were weighed in a molar ratio of 1:1, dissolved in dimethyl acetamide (DMAC), and reacted at 0° C. for 5 hours. Then, 1,3,5-triaminophenoxy benzene (TAB) was added thereto to perform chemical crosslinking, to obtain a polyamic acid (PAA) stock solution with a solid content of 15%. Subsequently, a fibrous mat of an oligomer was prepared by an electrostatic spinning technique, and finally subjected to imidization at 350° C. to obtain a porous polyimide fibrous mat. A scanning electron micrograph of the porous polyimide is shown in FIG. 2.

Figure 3:
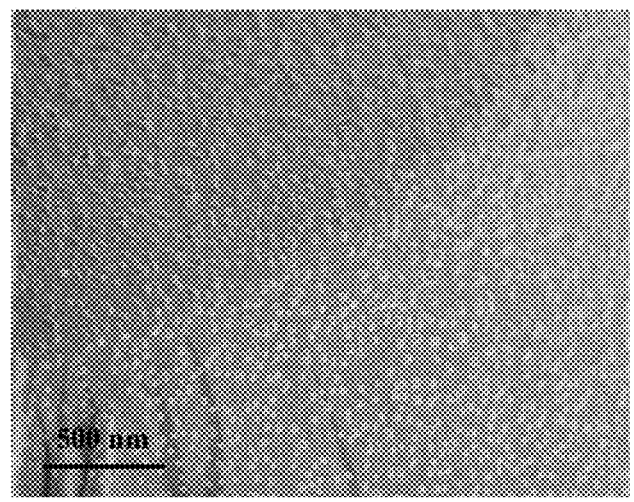
FIG. 3 is a scanning electron micrograph of a catalyst-supported polyimide prepared in the present invention.

(2) The prepared porous polyimide material was coated on its surface with a layer of silicon oxide film having a thickness of 10 nm by a vacuum coating technique. Then, a layer of nickel (or iron, cobalt) thin film having a thickness of 2 nm was sputtered on the polyimide by vacuum sputtering, which was used as a catalyst for growing carbon nanotubes. A scanning electron micrograph of the prepared catalyst-supported polyimide material is shown in FIG. 3.

Figure 4:
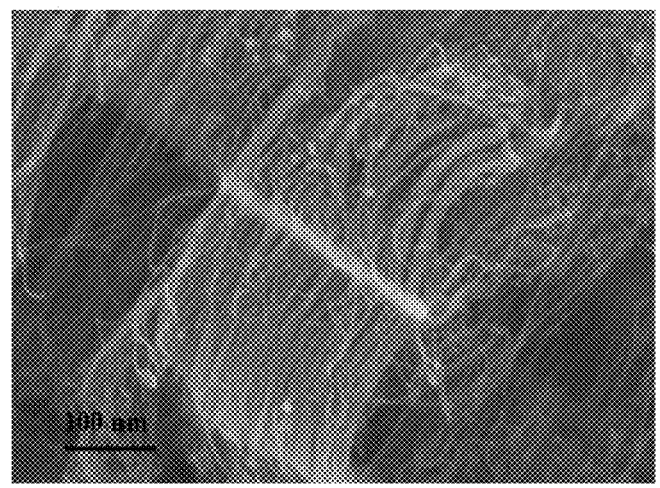
FIG. 4 is a scanning electron micrograph of a composite with in situ grown carbon nanotubes prepared in the present invention.

(3) The catalyst-supported porous polyimide was placed into a PECVD furnace, and vacuum was applied thereto such that the pressure in the furnace tube was 5~20 Pa. Then, $H_2$ was introduced as a carrier gas at a flow rate of 100 sccm. When the temperature was raised up to 300° C., a radio-frequency plasma emitter was turned on, with the radio-frequency power set at 200 W and the radio-frequency signal frequency set at 13.56 MHz. After treatment under the $H_2$ plasma environment for 30 min, ethyne was introduced at a flow rate of 20 sccm as a carbon source for growing carbon nanotubes, to grow carbon nanotubes for a period of 15 min. After the reaction was completed, the plasma emitter was turned off, and the resultant was cooled to room temperature along with the furnace under the $H_2$ atmosphere environment, to obtain a polyimide with a grown array of carbon nanotubes. A scanning electron micrograph of the above composite with in situ grown carbon nanotubes is shown in FIG. 4.

Figure 5:
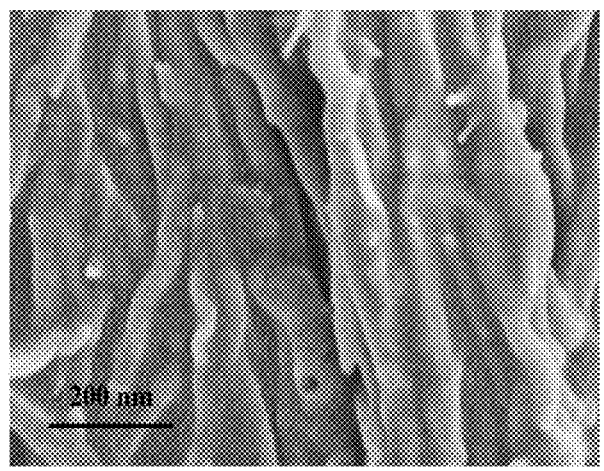
FIG. 5 is a scanning electron micrograph of an enclosed composite prepared in the present invention.

(4) The porous composite with grown carbon nanotubes was impregnated with a polyamic acid solution and subjected to thermal imidization at 350° C. Such an operation was repeated several times and thus the composite was densified, to finally obtain a dense carbon nanotube/polyimide composite. A scanning electron micrograph of the enclosed composite is shown in FIG. 5.

The resulting carbon nanotube/polyimide composite had a mass fraction of carbon nanotubes of 6.5 wt %, had excellent mechanical properties and thermal conductivity, and had a tensile breaking strength of up to 410 MPa, a tensile modulus of 3.2 GPa and a coefficient of thermal conductivity of 13 W/mK.

EXAMPLE 2

(1) 3,3,4,4-biphenyltetracarboxylic dianhydride (BPDA) and 4,4'-oxydianiline (ODA) were weighed in a molar ratio of 1:1, dissolved in dimethyl acetamide (DMAC), and reacted at 0° C. for 5 hours. Then, 1,3,5-triaminophenoxy benzene (TAB) was added thereto to perform chemical crosslinking, to obtain a polyamic acid (PAA) stock solution with a solid content of 15%. Subsequently, using a freeze-drying technique, the prepared gel was freeze-dried in liquid nitrogen, removed for the solvent therefrom using the freeze-drying technique, and finally subjected to imidization at 350° C. to obtain a porous polyimide material.

(2) The prepared porous polyimide material was coated on its surface with a layer of silicon oxide film having a thickness of 20 nm by a vacuum coating technique. Then, a layer of nickel (or iron, cobalt) thin film having a thickness of 10 nm was sputtered on the polyimide by vacuum sputtering, which was used as a catalyst for growing carbon nanotubes.

(3) The catalyst-supported porous polyimide was placed into a PECVD furnace, and vacuum was applied thereto such that the pressure in the furnace tube was 5~20 Pa. Then, $H_2$ was introduced as a carrier gas at a flow rate of 50 sccm. When the temperature was raised up to 450° C., a radio-frequency plasma emitter was turned on, with the radio-frequency power set at 100 W and the radio-frequency signal frequency set at 13.56 MHz. After treatment under the $H_2$ plasma environment for 30 min, ethyne was introduced at a flow rate of 50 sccm as a carbon source for growing carbon nanotubes, to grow carbon nanotubes for a period of 30 min. After the reaction was completed, the plasma emitter was turned off, and the resultant was cooled to room temperature along with the furnace under the $H_2$ atmosphere environment.

(4) The porous composite with grown carbon nanotubes was impregnated with a polyamic acid solution and subjected to thermal imidization at 350° C. Such an operation was repeated several times and thus the composite was densified, to finally obtain a dense carbon nanotube/polyimide composite.

The resulting carbon nanotube/polyimide composite had a mass fraction of carbon nanotubes of 8.2 wt %, had excellent mechanical properties and thermal conductivity, and had a tensile breaking strength of up to 479 MPa, a tensile modulus of 4.13 GPa and a coefficient of thermal conductivity of 17.3 W/mK.

EXAMPLE 3

(1) An epoxy resin (E-03, having an epoxide number of 0.00~0.04) was dissolved in 1-methoxy-2-propanol (MP) at room temperature, and stirred for 30 min to allow sufficient dissolution of the epoxy resin, to formulate an epoxy resin solution at a concentration of 30%. Then, a fibrous mat of the epoxy resin was prepared by an electrostatic spinning technique.

(2) The prepared porous epoxy resin material was coated on its surface with a layer of silicon oxide film having a thickness of 10 nm by a vacuum coating technique. Then, a layer of nickel (or iron, cobalt) thin film having a thickness of 10 nm was sputtered on the epoxy resin by vacuum sputtering, which was used as a catalyst for growing carbon nanotubes.

(3) The catalyst-supported porous epoxy resin was placed into a PECVD furnace, and vacuum was applied thereto such that the pressure in the furnace tube was 5-20 Pa. Then, $H_2$ was introduced as a carrier gas at a flow rate of 100 sccm. When the temperature was raised up to 200° C., a radio-frequency plasma emitter was turned on, with the radio-frequency power set at 300 W and the radio-frequency signal frequency set at 13.56 MHz. After treatment under the $H_2$ plasma environment for 10 min, ethyne was introduced at a flow rate of 10 sccm as a carbon source for growing carbon nanotubes, to grow carbon nanotubes for a period of 20 min. After the reaction was completed, the plasma emitter was turned off, and the resultant was cooled to room temperature along with the furnace under the $H_2$ atmosphere environment.

(4) The porous composite with grown carbon nanotubes was impregnated with an epoxy resin solution and cured in a vacuum oven at 100° C. Such an operation was repeated several times and thus the composite was densified, to finally obtain a dense carbon nanotube/epoxy resin composite.

The resulting carbon nanotube/epoxy resin composite had a mass fraction of carbon nanotubes of 5.5 wt %, had excellent mechanical properties and thermal conductivity, and had a tensile breaking strength of up to 32.2 MPa, a tensile modulus of 3.1 GPa and a coefficient of thermal conductivity of 9.8 W/mK.

EXAMPLE 4

(1) An epoxy resin (E-03, having an epoxide number of 0.00~0.04) was dissolved in 1-methoxy-2-propanol (MP) at room temperature, and stirred for 30 min to allow sufficient dissolution of the epoxy resin, to formulate an epoxy resin solution at a concentration of 20%. Then, a fibrous mat of the epoxy resin was prepared by an electrostatic spinning technique.

(2) The prepared porous epoxy resin material was coated on its surface with a layer of silicon oxide film having a thickness of 10 nm by a vacuum coating technique. Then, a layer of nickel (or iron, cobalt) thin film having a thickness of 5 nm was sputtered on the epoxy resin by vacuum sputtering, which was used as a catalyst for growing carbon nanotubes.

(3) The catalyst-supported porous epoxy resin was placed into a PECVD furnace, and vacuum was applied thereto such that the pressure in the furnace tube was 5~20 Pa. Then, $H_2$ was introduced as a carrier gas at a flow rate of 100 sccm. When the temperature was raised up to 150° C., a radio-frequency plasma emitter was turned on, with the radio-frequency power set at 300 W and the radio-frequency signal frequency set at 13.56 MHz. After treatment under the $H_2$ plasma environment for 10 min, ethyne was introduced at a flow rate of 20 sccm as a carbon source for growing carbon nanotubes, to grow carbon nanotubes for a period of 30 min. After the reaction was completed, the plasma emitter was turned off, and the resultant was cooled to room temperature along with the furnace under the $H_2$ atmosphere environment.

(4) The porous composite with grown carbon nanotubes was impregnated with an epoxy resin solution and cured in a vacuum oven at 100° C. Such an operation was repeated several times and thus the composite was densified, to finally obtain a dense carbon nanotube/epoxy resin composite.

The resulting carbon nanotube/epoxy resin composite had a mass fraction of carbon nanotubes of 6.2 wt %, had excellent mechanical properties and thermal conductivity, and had a tensile breaking strength of up to 35.1 MPa, a tensile modulus of 3.5 GPa and a coefficient of thermal conductivity of 10.2 W/mK.

EXAMPLE 5

(1) A phenolic resin and polyvinyl butyral (PVB) were dissolved in ethanol in which a mass ratio of the phenolic resin, PVB, and ethanol was 40:0.5:55.5, and stirred for 2 hours to be mixed homogeneously, to obtain a phenolic resin solution. Subsequently, an as-spun fibrous mat of the phenolic resin was prepared by an electrostatic spinning technique, which was finally cured at 180° C. to obtain a porous fibrous mat of the phenolic resin.

(2) The prepared porous phenolic resin material was coated on its surface with a layer of silicon oxide film having a thickness of 20 nm by a vacuum coating technique. Then, a layer of nickel (or iron, cobalt) thin film having a thickness of 2 nm was sputtered on the phenolic resin by vacuum sputtering, which was used as a catalyst for growing carbon nanotubes.

(3) The catalyst-supported porous phenolic resin was placed into a PECVD furnace, and vacuum was applied thereto such that the pressure in the furnace tube was 5~20 Pa. Then, $H_2$ was introduced as a carrier gas at a flow rate of 10 sccm. When the temperature was raised up to 200° C., a radio-frequency plasma emitter was turned on, with the radio-frequency power set at 500 W and the radio-frequency signal frequency set at 13.56 MHz. After treatment under the $H_2$ plasma environment for 30 min, ethyne was introduced at a flow rate of 20 sccm as a carbon source for growing carbon nanotubes, to grow carbon nanotubes for a period of 60 min. After the reaction was completed, the plasma emitter was turned off, and the resultant was cooled to room temperature along with the furnace under the $H_2$ atmosphere environment.

(4) The porous material with grown carbon nanotubes was impregnated with a phenolic resin solution and cured at 180° C. Such an operation was repeated several times and thus the composite was densified, to finally obtain a dense carbon nanotube/phenolic resin composite.

The resulting carbon nanotube/phenolic resin composite had a mass fraction of carbon nanotubes of 8.1 wt %, had excellent mechanical properties and thermal conductivity, and had a tensile breaking strength of up to 235.1 MPa, a tensile modulus of 7.5 GPa and a coefficient of thermal conductivity of 19.8 W/mK.

EXAMPLE 6

(1) A phenolic resin and polyvinyl butyral (PVB) were dissolved in ethanol in which a mass ratio of the phenolic resin, PVB, and ethanol was 40:0.5:55.5, and stirred for 2 hours to be mixed homogeneously, to obtain a phenolic resin solution. Subsequently, an as-spun fibrous mat of the phenolic resin was prepared by an electrostatic spinning technique, which was finally cured at 180° C. to obtain a porous fibrous mat of the phenolic resin.

(2) The prepared porous phenolic resin material was coated on its surface with a layer of silicon oxide film having a thickness of 50 nm by a vacuum coating technique. Then, a layer of nickel (or iron, cobalt) thin film having a thickness of 1 nm was sputtered on the phenolic resin by vacuum sputtering, which was used as a catalyst for growing carbon nanotubes.

(3) The catalyst-supported porous phenolic resin was placed into a PECVD furnace, and vacuum was applied thereto such that the pressure in the furnace tube was 5~20 Pa. Then, $H_2$ was introduced as a carrier gas at a flow rate of 10 sccm. When the temperature was raised up to 150° C., a radio-frequency plasma emitter was turned on, with the radio-frequency power set at 300 W and the radio-frequency signal frequency set at 13.56 MHz. After treatment under the $H_2$ plasma environment for 30 min, ethyne was introduced at a flow rate of 20 sccm as a carbon source for growing carbon nanotubes, to grow carbon nanotubes for a period of 30 min. After the reaction was completed, the plasma emitter was turned off, and the resultant was cooled to room temperature along with the furnace under the H$_2$ atmosphere environment.

(4) The porous material with grown carbon nanotubes was impregnated with a phenolic resin solution and cured at 180° C. Such an operation was repeated several times and thus the composite was densified, to finally obtain a dense carbon nanotube/phenolic resin composite.

The resulting carbon nanotube/phenolic resin composite had a mass fraction of carbon nanotubes of 7.2 wt %, had excellent mechanical properties and thermal conductivity, and had a tensile breaking strength of up to 185.8 MPa, a tensile modulus of 6.1 GPa and a coefficient of thermal conductivity of 18.2 W/mK.

As can be seen from the above examples, a carbon nanotube/polymer composite material is prepared in the present invention, which has excellent mechanical properties and thermal conductivity.

The foregoing description of the examples is provided merely to help understanding the method of the present invention and the core idea thereof. It should be pointed out that those skilled in the art can also make several improvements and modifications without departing from the principle of the present invention, and these improvements and modifications also fall within the scope of protection of the claims of the present invention.

The invention claimed is:

1. A method for preparing a carbon nanotube/polymer composite material, comprising the steps of:
    step 1, subjecting a polymer monomer solution to electrostatic spinning or freeze-drying to obtaina porous polymer;
    step 2, coating a nano-silicon oxide film on a surface of the porous polymer by vacuum coating;
    step 3, depositing a metal catalyst nano-film on the nano-silicon oxide film by vacuum sputtering, wherein the thickness of the nano-silicon oxide film is 5~50 nm, and the thickness of the metal catalyst nano-film is 1~10 nm; and
    step 4, growing a carbon nanotube array in situ on a surface of the metal catalyst nano-film on the porous polymer by plasma enhanced chemical vapor deposition to obtain a carbon nanotube/polymer porous material;
    wherein the growing of the carbon nanotube array in situ is carried out under conditions of: a temperature of 200-450° C. and under a pressure of 5~20 Pa, H$_2$ as a carrier gas, a plasma power of 10~500 W and a radio-frequency signal frequency set at 13.56 MHz.

2. The method according to claim 1, wherein the porous polymer is selected from the group consisting of polyimide, phenolic resin, epoxy resin, polybenzimidazole and polyamide, or a thereof.

3. The method according to claim 1, wherein the metal catalyst nano-film is selected from the group consisting of nickel, iron and cobalt, or a mixture thereof.

4. The method according to claim 1, wherein the growing of the carbon nanotube array in situ is carried out under the following conditions: H$_2$ as a carrier gas, acetylene or methane as a carbon source, and a growing duration of 5~60 min.

* * * * *

UNITED STATES PATENT AND TRADEMARK OFFICE
CERTIFICATE OF CORRECTION

PATENT NO. : 11,167,991 B2
APPLICATION NO. : 16/123279
DATED : November 9, 2021
INVENTOR(S) : Wei Feng et al.

Page 1 of 1

It is certified that error appears in the above-identified patent and that said Letters Patent is hereby corrected as shown below:

In the Claims

Column 10, Line 22, Claim 2, insert -- mixture -- before "thereof"

Signed and Sealed this
Eighteenth Day of January, 2022

Drew Hirshfeld
*Performing the Functions and Duties of the*
*Under Secretary of Commerce for Intellectual Property and*
*Director of the United States Patent and Trademark Office*